(12) United States Patent
Green (10) Patent No.: US 7,352,255 B1
(45) Date of Patent: Apr. 1, 2008

(54) CIRCUIT, SYSTEM, AND METHOD FOR FINE TUNING CRYSTAL FREQUENCY ACCURACY

(75) Inventor: David Green, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 108 days.

(21) Appl. No.: 11/011,626

(22) Filed: Dec. 13, 2004

Related U.S. Application Data

(60) Provisional application No. 60/532,679, filed on Dec. 23, 2003.

(51) Int. Cl.
*H03B 5/32* (2006.01)
*H03L 5/00* (2006.01)

(52) U.S. Cl. .................... 331/158; 331/116 FE; 331/36 C (58) Field of Classification Search ........... 331/158, 331/116 R, 116 FE, 36 C
See application file for complete search history.

(56) References Cited

U.S. PATENT DOCUMENTS

| | | | |
|---|---|---|---|
| 6,271,733 B1* | 8/2001 | Alzu et al. | 331/108 D |
| 6,337,600 B1* | 1/2002 | Shigemori et al. | 331/16 |
| 7,109,810 B2* | 9/2006 | Senthilkumar et al. | 331/116 R |

* cited by examiner

*Primary Examiner*—Robert Pascal
*Assistant Examiner*—James Goodley (57) ABSTRACT

Circuits, systems, and methods for fine tuning crystal frequency accuracy are disclosed. One such circuit fine tunes crystal frequency accuracy with a tunable fractional capacitance. The circuit includes an effectively constant capacitance coupled, e.g., fixedly, with the crystal. A second capacitance is controllably coupleable with the crystal. A switching device is controllable for switchably coupling the second capacitance with the crystal. An effective capacitance value associated with the second capacitance varies according to a time associated with that switchable coupling. The crystal resonating frequency changes according to a capacitive loading thereof, which includes the first capacitance and the effective capacitance value of the second capacitance, effectively time multiplexed therewith.

18 Claims, 7 Drawing Sheets

CIRCUIT, SYSTEM, AND METHOD FOR FINE TUNING CRYSTAL FREQUENCY ACCURACY

RELATED U.S. APPLICATION

This application claims priority to U.S. Provisional Patent Application Ser. No. 60/532,679, entitled Fine Tuning Crystal Frequency Accuracy Through Fractional Capacitive Method, by David Green, filed on Dec. 23, 2003 and assigned to the assignee of the present application. To the extent not repeated herein, this related application is incorporated by reference.

TECHNICAL FIELD

The present invention relates generally to the field of electronics. More particularly, embodiments of the present invention relate to circuits, systems, and methods for fine tuning crystal frequency accuracy.

BACKGROUND

The technique of programmable frequency shifting of a Pierce crystal oscillator network is well understood in the art. This technique is widely used for clock generator chips (integrated circuits) and in applications where one system is tracked and another system is synchronized therewith. The Pierce oscillator functions as a resonant tank circuit, which comprises an active gain element, biasing elements, the resonating crystal and capacitive shunts for each crystal leg. For a crystal to resonate at the specified frequency of interest for a Pierce oscillator, certain loading criteria must be properly observed. Known as the Barkhausen effect, specified value ranges for gain and phase are applied to the system for oscillation to occur.

The oscillator frequency can be shifted or pulled through selection of loading capacitors. Different capacitance values results in slight phase changes due to changes in reactance. In order to maintain oscillation, subtle changes in phase require an equal offset in frequency to compensate for the difference.

Some conventional devices employing Pierce oscillators provide internal crystal capacitor selection. These capacitors are deployed within the device, e.g., an integrated circuit (IC) device, as an array of capacitive elements with a particular unit capacitance value. Each such element occupies, e.g., consumes, a certain "unit capacitance area." Depending on the capacitive range of interest for the crystal, the silicon area required may add to a significant portion of the die area.

The internal capacitive weighting array typically comprises a selection of differently sized capacitors, e.g., with differing capacitance values. These capacitors can be added, or removed in parallel to appropriately load the crystal. Typically, such increments and decrements are partial capacitance units. For example, one such device provides a fractional capacitance range of 0.5 to 0.0625 pF. In order to maintain consistent manufacturing standards, the capacitors must be manufactured will little variance because as the capacitance value decreases, error margin increases.

Field effect transistor (FET) switching is typically used to enable a distinct capacitor array for each crystal leg. Typical architecture enables the capacitors in parallel mode. Several approaches are used in various applications for driving the FET switching, including analog-to-digital converter (ADC) technology such as for an analog control voltage controlled crystal oscillator (VCXO) type architecture. Another approach uses a variable capacitor, e.g., a varactor. Common convention is to introduce DC bias to the tank in order to modify the capacitance through DC voltage means.

An operative principle in these approaches is modification of the shunt reactance, which changes phasing relationships. Phasing changes lead to frequency shifting, which bring the system back into equilibrium. Other approaches include use of direct digital look up tables, binary weighting and other means appropriate for a particular application. The "state" of the capacitor selection, e.g., the capacitance value selected, remains static for a given frequency of interest. Where the varactor approach to driving FET switching is used, the "control" bias voltage typically remains stable for any given frequency of interest.

Figure 1:
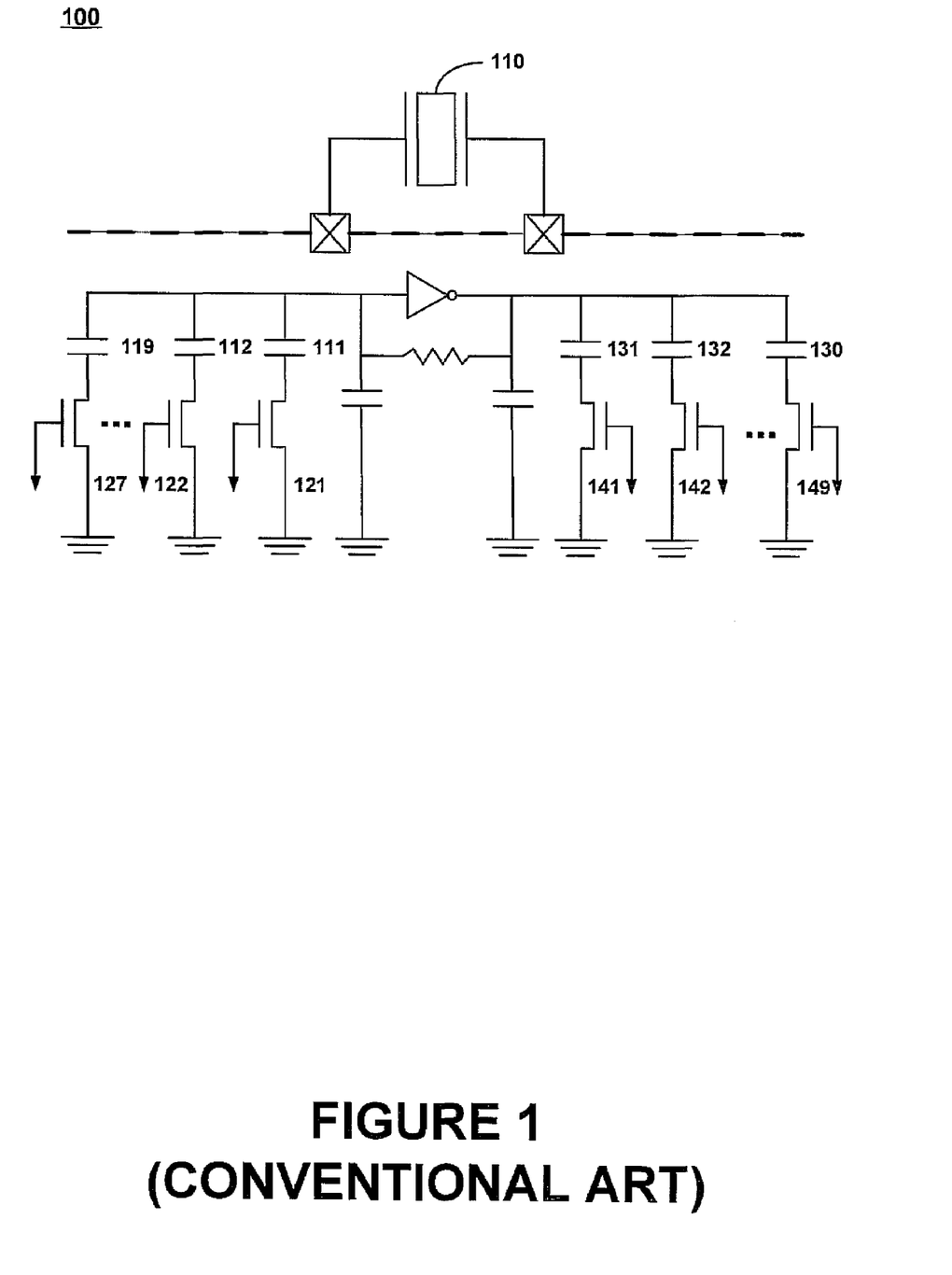
FIG. 1 depicts a conventional capacitive array.

A conventional capacitive array 100 for shifting the oscillating frequency of crystal 110 of one typical approach is shown in FIG. 1. The crystal loading capacitors 111-119 and 131-139 (in practice, there can be any number of capacitors) are respectively switched by activating FETs 121-129 and 141-149. Other transistors or single pole single throw (SPST) switch can be used, represented herein with these FETs. The resolution of the target frequency depends on the accuracy and resolution of the available capacitor selection.

As seen in FIG. 1, typical conventional approaches use a number of capacitors on each crystal leg, each capacitor having a FET or other transistor, switch, etc. associated therewith. Silicon area is used for each capacitor configured within an IC. This can be a significant issue, because the silicon required may be significant, depending on the capacitive range of interest for a particular resonant crystal. Further, requiring a FET or other transistor, switch, etc. for switching each capacitor, as needed, can pose challenges related to control circuit and conductor routing complexity, reliability and cost.

SUMMARY

Accordingly, what is needed is a circuit, system, and/or method for fine tuning crystal frequency accuracy that requires fewer capacitors for effective crystal loading than conventional approaches typically demand. What is also needed is a circuit, system, and/or method for fine tuning crystal frequency accuracy that occupies less of an IC's area than conventional approaches typically demand. Further, what is needed is a circuit, system, and/or method for fine tuning crystal frequency accuracy that requires a simpler switching architecture than conventional approaches provide. It is desirable that such an oscillator circuit, system, and/or method for fine tuning crystal frequency accuracy achieve these advantages with frequency resolution meeting or surpassing that of conventional capacitive arrays.

The embodiments for fine tuning crystal frequency accuracy with a tunably "fractional," e.g., time variable capacitance requires fewer capacitors for effective crystal loading than conventional approaches typically demand. The embodiments of the present invention may occupy (and the method is performed requiring) less area of an IC on which they are deployed than conventional approaches typically demand. Further, embodiments of the present invention may require simpler switching than conventional approaches typically demand and achieve these advantages with frequency resolution meeting or surpassing that of conventional capacitive arrays.

A circuit, system, and method for fine tuning crystal frequency accuracy are disclosed herein. In one embodiment, a circuit fine-tunes crystal frequency accuracy with a tunably time variable capacitance to achieve an effectively fractional capacitance. The circuit includes a capacitance that may effectively be constant and coupled, e.g., fixedly, with the crystal. A second capacitance is controllably coupleable with the crystal. A switching device is controllable for switchably coupling the second capacitance with the crystal. An effective capacitance value associated with the second capacitance varies according to a time associated with that switchable coupling. The crystal resonating frequency changes according to a capacitive loading thereof, which includes a summation of the first capacitance and the effective capacitance value of the second capacitance, effectively time multiplexed therewith.

DETAILED DESCRIPTION

Embodiments are directed to a circuit, system, and method for fine tuning crystal frequency accuracy, e.g., for an oscillator. In one embodiment, a circuit fine tunes crystal frequency accuracy with a tunable fractional capacitance. Reference is now made in detail to several embodiments of the invention, examples of which are illustrated in the accompanying drawing figures. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, one of ordinary skill in the art will realize that embodiments of the present invention may be practiced without these specific details. In other instances, well-known circuits, devices, methods, systems, processes, procedures, components, and apparatus have not been described in detail so as not to unnecessarily obscure aspects of the present invention.

Portions of the detailed description that follows are presented and discussed in terms of a process. Although steps and sequencing thereof are disclosed in figures herein (e.g., FIGS. 4 and 7) describing the operations of these processes (e.g., processes 400 and 700, respectively), such steps and sequencing are exemplary. Embodiments of the present invention are well suited to performing various other steps or variations of the steps recited in the flowcharts of the figures herein, and in a sequence other than that depicted and described herein.

Embodiments of the present invention provide a circuit, system, and method for fine tuning crystal frequency accuracy. In one embodiment, a circuit fine tunes crystal frequency accuracy with a tunable fractional capacitance. Therefore, embodiments of the present invention may need fewer capacitors for effective crystal loading, and the capacitors may occupy less IC space, in comparison with conventional approaches. Further, embodiments of the present invention operate with a simpler switching architecture than conventional approaches typically demand. Requiring fewer capacitors and less switching complexity allow these embodiments to achieve advantages related to efficiency of device design (e.g., more silicon available for other uses), and control and conductor routing. These advantages can have related benefits including better reliability and lower cost. Further, embodiments of the present invention achieve such advantages and benefits with frequency resolution meeting or surpassing that of conventional capacitive arrays.

One embodiment may employ a technique analogous to fractional-N and/or a dual modulus architecture, for instance for fine tuning crystal frequency. The concept and naming convention of "fractional-C" (Frac-C) is analogous to concept and naming convention found in traditional dual modulus prescaler structures where the outcome is similar to that of a fractional-N (Frac-N) phase locked loop (PLL) synthesis solution. Utilizing a dual-modulus prescaler, driven by two controlled dividers over a given time interval, a fractional divisor value is achieved wherein the effective "duty-cycle" of the control dividers weights the fractional outcome to achieve a equivalent fractional value greater than zero offset to something less or equal to that an integer count offset of the overall divisor value. The weighting is dictated by the respective values loaded into the control divisors.

For example, suppose that a prescaler divide of 10.5 is necessary to create the proper synthesized frequency. Since 10.5 cannot be directly achieved through direct integer division, a dual-modulus approach can be taken whereby one control divisor counts down for one-half the time; instructing the prescaler to divide by N while the other time interval half is consumed by instructing the prescaler to divide by N+1. A prescaler of 10/(10+1) achieves this purpose. Adjusting the weighting and time interval allows fractional count ratios to occur.

The Frac-C method analogizes the Frac-N approach for numerical precision. However, capacitive precision described herein is not directly obtained by taking on direct integer capacitive values, in contrast to conventional capacitive arrays. Pulse width modulation (PWM) control, which can be generated internally to a common deploying device such as an IC, functions in one embodiment to enable and disable capacitive summing functions analogous to that of the prescaler. In one embodiment, the Frac-C capacitive summer comprises two capacitors, acting in series or parallel to weight an overall response. In addition, like 4-modulus or other multi-modulus schemes, the concept is extensible to other capacitor topologies.

Using a PWM control signal effectively breaks up the C and C+1 weighting summing ratios over time. An integration effect is inherent in the feedback response of the oscillator, which comprises high-Q crystal tank (e.g., relatively sluggish in comparison to the PWM signal) in conjunction with shunt capacitors, similar to the Pierce oscillator configuration discussed above. The net effect is to "pull" to an oscillation frequency that neither capacitor can achieve in a standalone configuration.

In the configuration described, the circuit rapidly and purposely switches in and out a capacitance in parallel (e.g., with a pre-existing capacitor) in a resonant crystal tank such that that a net, accumulated, "average," etc. output frequency is achieved. This method differs from the conventional solutions in that rapid switching is employed to seek an equivalent "fractional" capacitive value of two capacitors. In comparison, conventional approaches, such as described above, seek best resolution through the closed fixed capacitive array match to the actual target frequency through static, or relatively slow switched means.

In the circuits, systems, and methods described herein, the time interval spent between C and C+1 capacitance values results in an average $C_{avg}$ value, based on the effective "weighting" ranging from a known "C" (minimum capacitance) to a "C+1" (maximum capacitance, e.g., "always on," continuously switched in, etc.). It should be understood, that unlike the Frac-N concept where a integer divisor value can be N/(N+1), the "C+1" notation herein is indicative of a unit of a second capacitor, e.g., of increased capacitance; it is not to be construed as to necessary mean one unit of extra capacitance in terms of capacitive units such as picofarads (pF), nanofarads (nF), etc. Selection of C and C+1 is determined by engineering factors including pullabilty range criteria and crystal loading. Further, the notion of allowing an external implementation of one or both allows for customization of crystal pull ability for specific applications.

The Frac-C concept operates on the principle of introducing a high rate of capacitive "dithering" to the crystal oscillator network through application of switched PWM techniques. Dithering is way of integrating a switching response by distributing the noise and effective capacitance over frequency.

Figure 2:
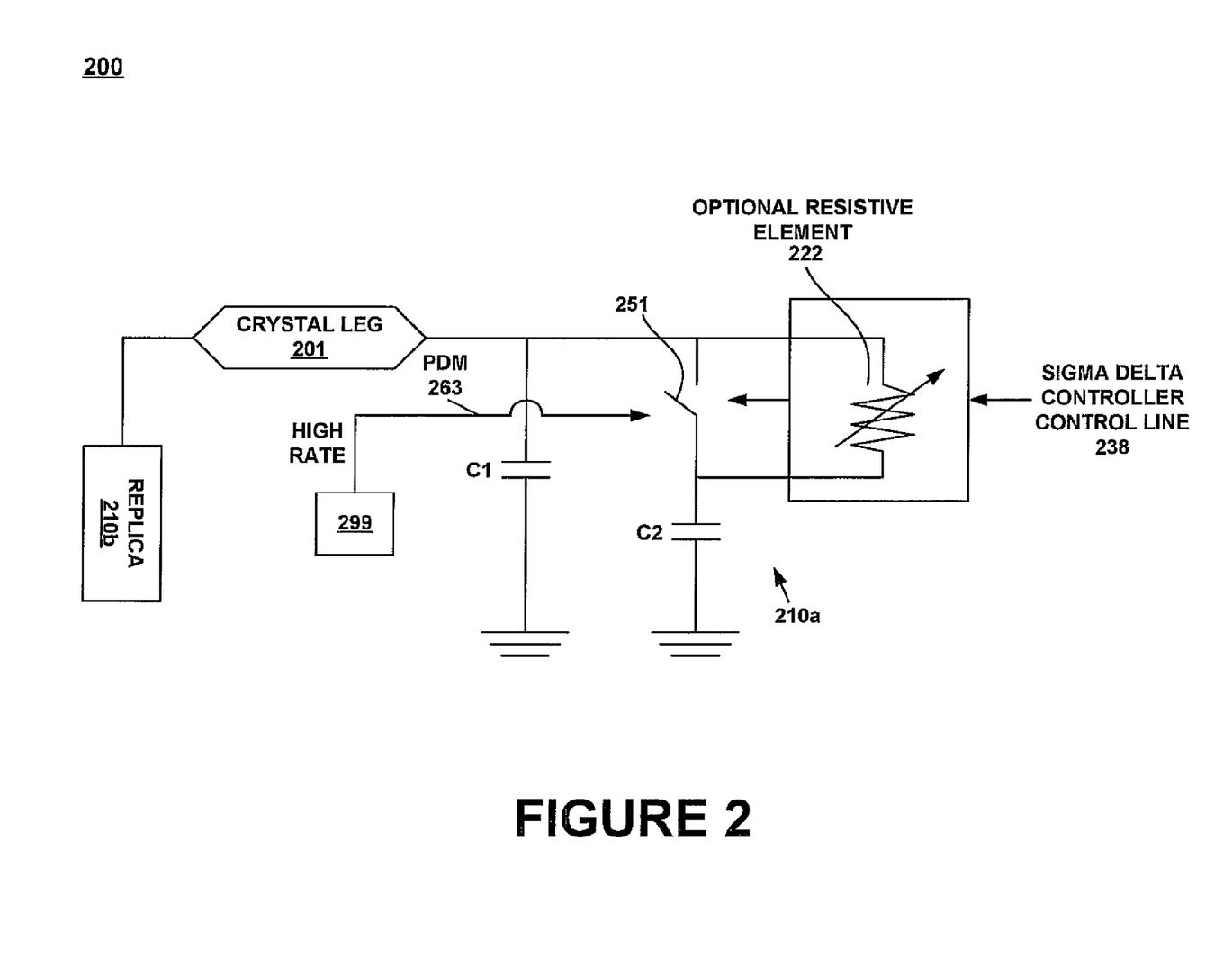
FIG. 2 depicts an exemplary circuit for fine tuning crystal frequency accuracy with a tunable fractional capacitance, according to an embodiment of the present invention.

FIG. 2 depicts an exemplary circuit 200 for fine tuning crystal frequency accuracy with a tunable fractional capacitance, according to an embodiment of the present invention. Circuit 200 comprises two tunable capacitor circuit components 210a and 210b. Circuit component 210b essentially replicates circuit component 210a, which is described herein, and each component couples to a leg of resonant crystal 201.

Circuit component 210a comprises two units of capacitors C1 and C2. Capacitor C1 holds a unit capacitance value 'C', and capacitor C2 holds a unit capacitance value plus an capacitive value offset, represented herein with '+1' designator. The two capacitor units comprise C and C+1 unit capacitors per crystal leg. It is appreciated that more than two capacitors can be used; in one embodiment each circuit component 210a and 210b comprises two or more capacitors.

In one embodiment, design is simplified and sensitivity to producing extremely small valued capacitor arrays is reduced by using fewer capacitances, as compared to conventional approaches. Each such capacitance can have a larger capacitance value, which can perform equivalent fractional capacitive functions. This achieves excellent fine tuning results. In the present embodiment, the two larger capacitors, with one switching FET 251 (or e.g., another transistor or SPST switch), provides a simpler circuit than the array of smaller capacitors with one FET per capacitor, typical in conventional schemes.

Enabling capacitive offset determines crystal 'pull-ability', which is synonymous to shifting the crystal resonant frequency. By changing the crystal capacitive loading, the crystal network must shift in frequency in order to maintain the phase relationship necessary for oscillation. Without this frequency shift, this phase relationship varies and the oscillation dampens and/or dies. 'Pull-ability' is normally specified in part-per million (PPM) units. The crystal being so "pulled" through capacitive loading, is forced to resonate at a frequency off (e.g., different) from its "nominal" or center resonant frequency. In one exemplary embodiment, this frequency shift is ±200 PPM, which is useful for a specific application. As the frequency shift is a normalized variable designated in parts per million, an exemplary crystal nominally resonant at 10 MHz crystal that exhibits 1 PPM of offset produces 10 Hz of frequency shift. Similarly, a ±200 PPM range for a 10 MHz crystal translates to a ±2000 Hz offset from the nominal 10 MHz center position.

The PWM dithering of the switched capacitor C2 can by fed by a number of sources such as synchronous or asynchronous feeds and may even benefit from pseudo noise generated sources for noise distribution or noise shaping. The term 'feed' implies that circuit 200 is part of a larger system 299 that provides frequency information feedback such that circuit 200 can synchronize off another system. That is, the source or parent system 299 feeds reference clocking information to the tandem circuit 200 that synchronizes, or phase locks to this source. The update rate is such that the noise energy introduced by the fast switching of FET 251 minimizes noise injection within the crystal loop bandwidth. As the weighting capacitor C2 is dithered, the averaging effect on the crystal network is such that a Frac-C equivalent loading is obtained. Crystal network 200 can be modulated by any of a number of methods.

Establishing a ratio between the time the capacitance of capacitor C1 is applied to the crystal 201 without the capacitance of capacitor C2 and the time that the capacitance of capacitor C2 is applied therewith (e.g., when capacitor C2 is switched in) creates an averaged weighting effect, which can effectively be represented as an equivalent capacitance. Depending on the weighting time and averaged dithering time, fractional ratios from a "zero offset" (the capacitance C of capacitor C1 alone) to "capacitance C plus one unit" can be achieved. The term "zero offset" refers to C, and the "C+1 unit" refers to the capacitive offset. Such capacitive offset is then rapidly switched (e.g., on/off) in the system via switch 251 to create the effective Frac-C effect. Switch 251 is controlled in one embodiment with frequency source 299, such as with PWM signal 263. In one embodiment, switch 251 is also controlled with a sigma delta controller 238, which can have a resistive element 222.

In one embodiment, the PWM modulation may be designed to ensure that proper noise shaping occurs when viewed in the frequency domain. This response may be shaped such that the majority of distributed noise resides outside the bandwidth of crystal 201. Effective design of PWM 263 results in a dithering, or pseudo random dithering rate that equates to pushing the noise generated by rapid switching as far away from the crystal carrier 201 as possible. The further the noise is pushed, the more effective the crystal 201 is in attenuating any offset noise due to the inherent crystal Q of the oscillator network 200. In one embodiment, circuit 200 is operated with a conventional frequency source in system 299 such that the combination of frequency reference and PLL phase noise attenuation is taken into account for optimal response.

Figure 3:
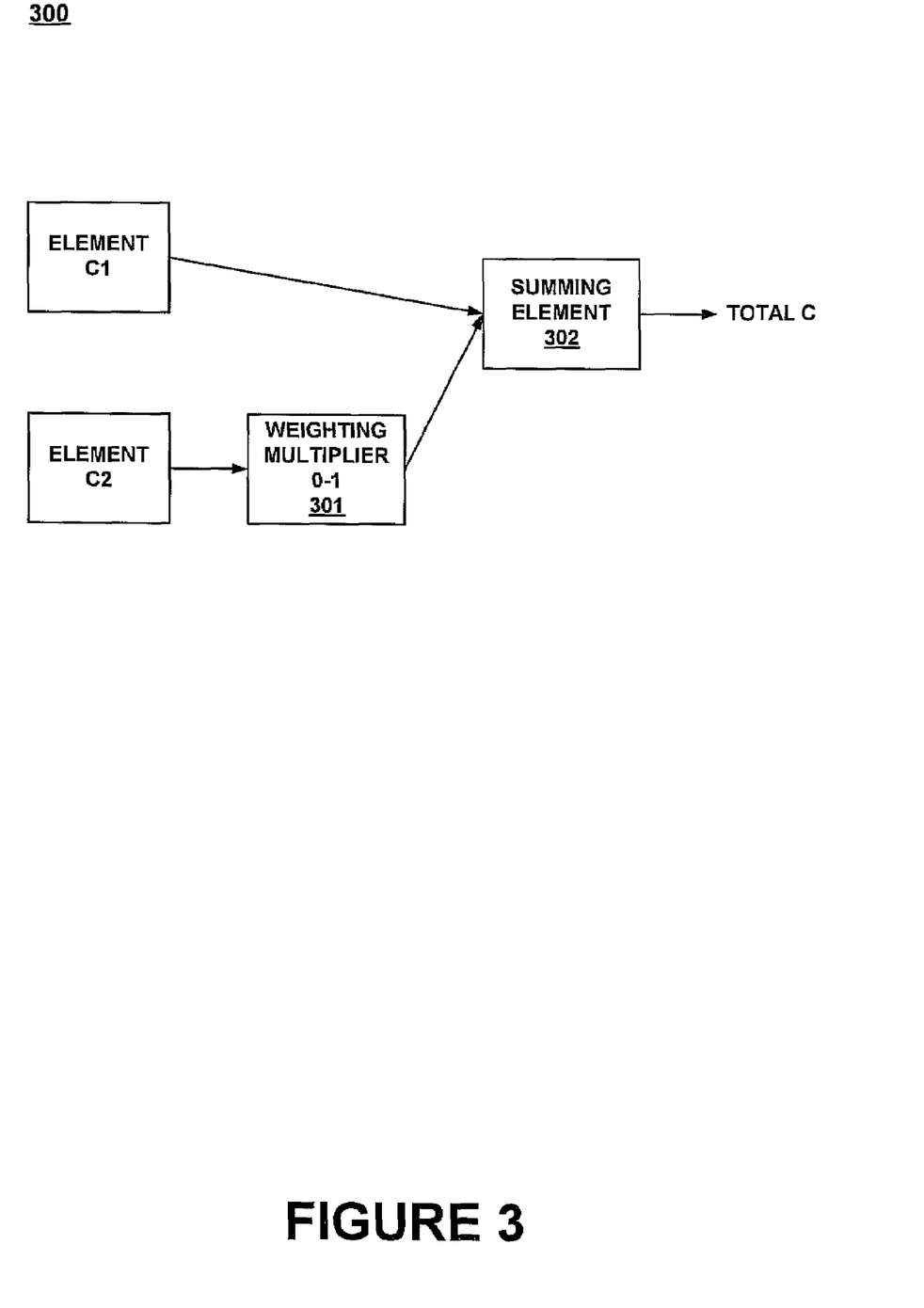
FIG. 3 depicts an exemplary system for achieving a fractional capacitance, according to an embodiment of the present invention.

FIG. 3 depicts an exemplary system 300 for achieving a fractional capacitance, according to an embodiment of the present invention. Capacitive element C1 provides a constant capacitance value C to a summing element 302. The total capacitance (Total C) is the equivalent of the C1 capacitance summed with the capacitance of capacitive element C2, wherein the capacitance of capacitive element C2 is multiplied by weighting multiplier 301.

Weighting multiplier 301 multiplies the capacitance of capacitive element C2 with a weighting function ranging from 0 to 1, where 0 indicates a static "off" condition and 1 indicates a static "on" condition. In between 0 and 1, the capacitance of capacitive element C2 is provided to summing element 302 for varying amounts of time. While the capacitor C2 is effectively switched either on or off, the effective switching of this event creates the desired multiplication effect that normally resides between the "0" and "1" condition.

Figure 4:
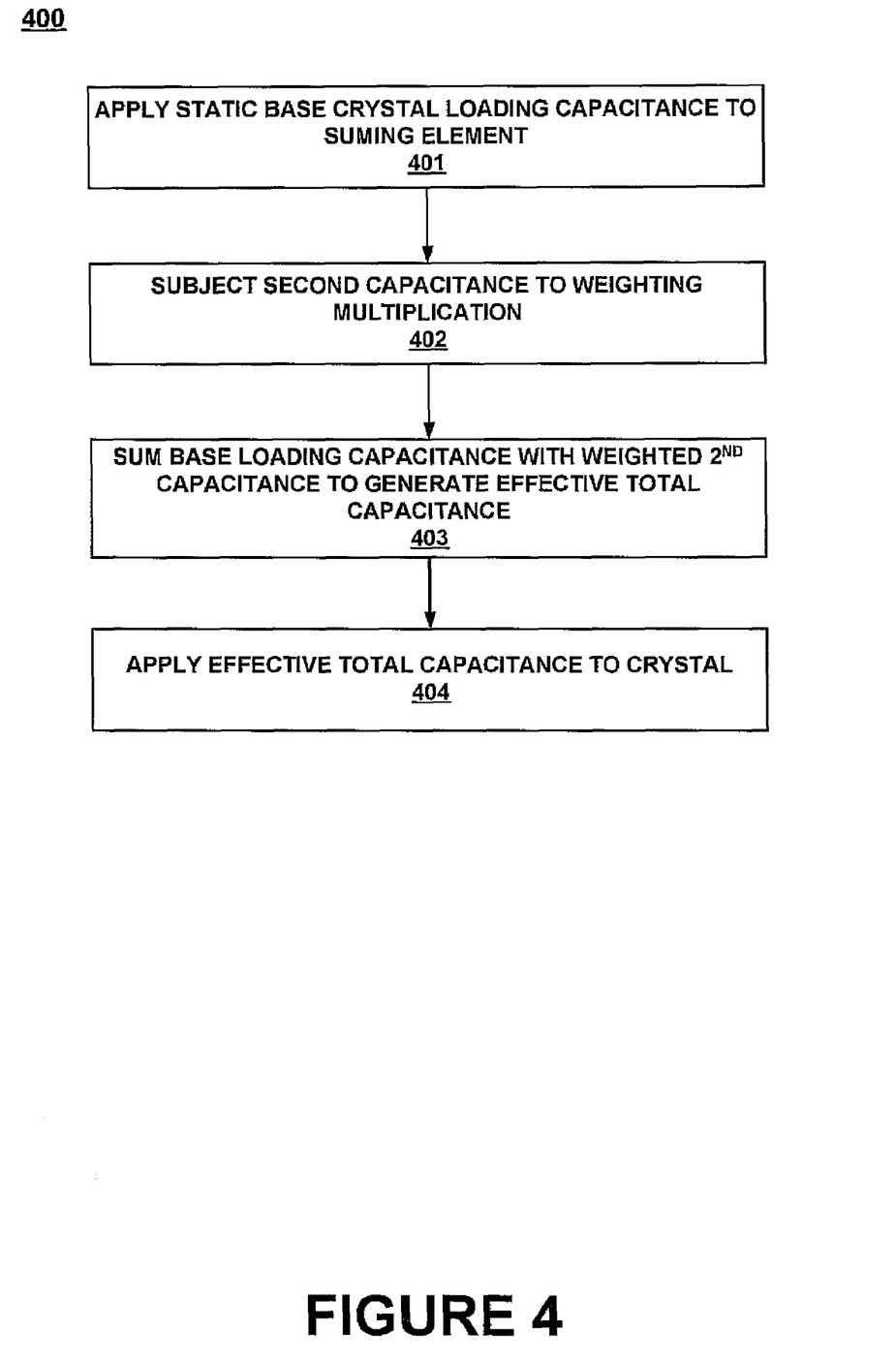
FIG. 4 is a flowchart of an exemplary method for achieving a fractional capacitance, according to an embodiment of the present invention.

FIG. 4 is a flowchart of an exemplary process 400 for achieving a fractional capacitance, according to an embodiment of the present invention. Process 400 begins with step 401, wherein a static base crystal loading capacitance is applied to a summing element.

In step 402, a second capacitance is subjected to a weighting multiplication, such as by timed switching modulation. For instance, for a part of a time interval, the second capacitance is applied to the summing element and for another part of the time the second capacitance is not so applied. This results in an effective weighting of the switched capacitance as it is applied to the summing element.

In step 403, the base crystal loading capacitance is summed with the weighted switched capacitance to generate an effective total capacitance. In step 404, the total capacitance so generated is applied to the resonant crystal, which changes the frequency of resonance thereof, completing process 400.

Figure 5:
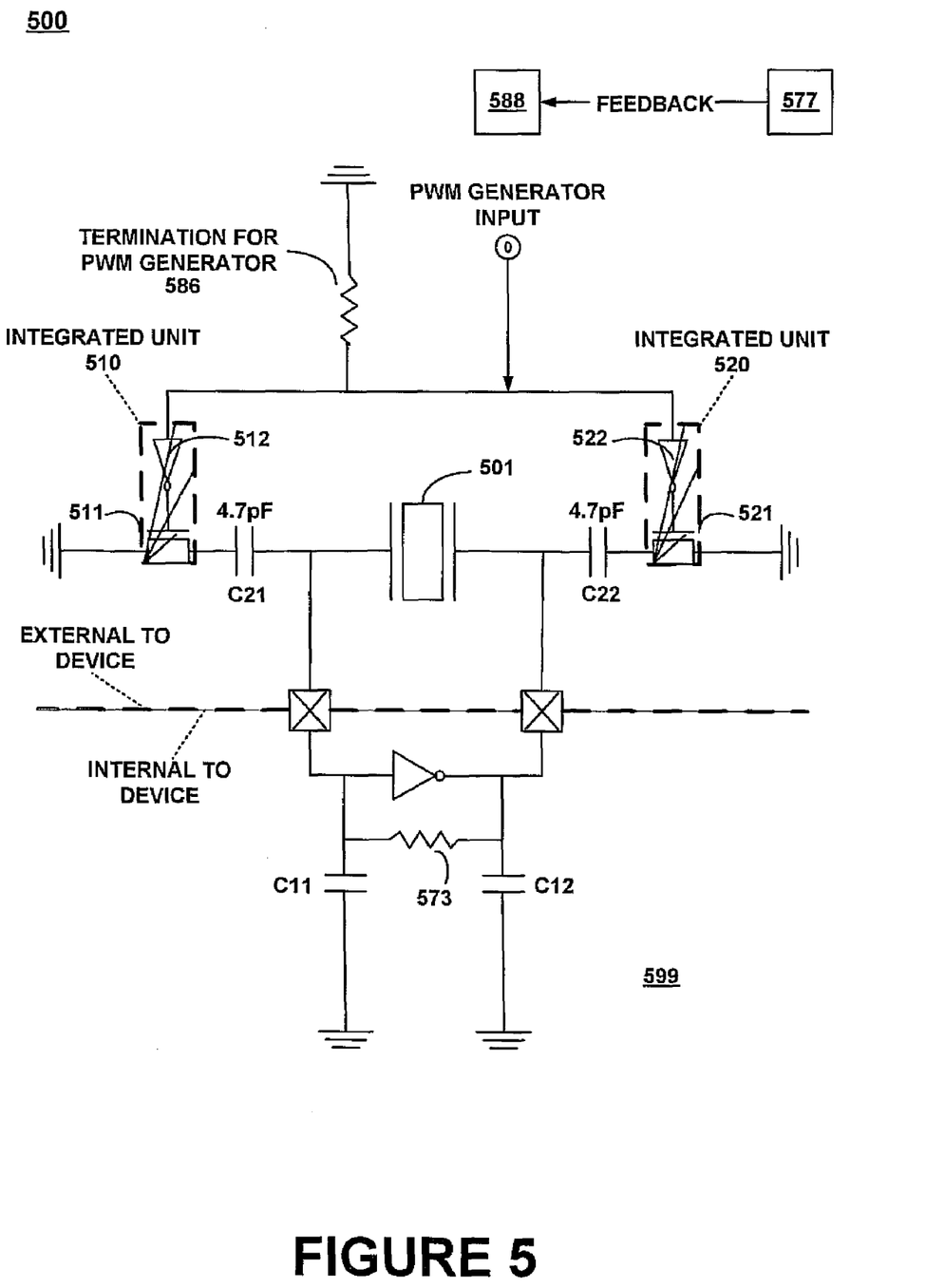
FIG. 5 depicts another exemplary circuit for fine tuning crystal frequency accuracy with a tunable fractional capacitance, according to an embodiment of the present invention.

FIG. 5 depicts an exemplary circuit 500 for fine tuning crystal resonant frequency accuracy with a tunable fractional capacitance, according to an embodiment of the present invention. Two integrated circuit elements 510 and 520 are coupled, one per crystal leg, to a resonant crystal 501 serve to enable fast switching FETs. Circuit elements 510 and 520 are integral to (e.g., comprise part of) an IC device 599. Circuit elements 510 and 520 each have respective FETs 511 and 521 (e.g., or another transistor or SPST switch). FET 511 and FET 521 are respectively driven by an external PWM generator 588 through the inverter drivers 512 and 522.

Internal to IC device 599, a portion of the crystal tank feeds gain to a crystal 501 with a resistive feedback element and fixed loading capacitors C11 and C12. Loading capacitors C11 and C12 analogize capacitor C1, shown in FIG. 2. The capacitors C21 and C22, which are in one embodiment external to IC device 599, are respectively switched by FETs 511 and 522 to enable adding their capacitances to crystal 501, analogously to the switching of capacitor C2, shown in FIG. 2. Each side of the crystal 501 is then driven by the output of PWM driver 588, or e.g., the sigma-delta converter 238 shown in FIG. 2, etc.

In any case, capacitors C11 and C12 and/or C21 and C22 may reside off IC device 599, or instance, in the same package as the die thereof, or in one embodiment, outside the package thereof. Advantageously, locating the "fractional-C" capacitances C11 and C22 off the silicon die of IC device 599 allows convenient adjustment and/or changing of the pulling range, which can thus be readily optimized for specific applications. This beneficial feature is especially advantageous in comparison to more generic fully silicon embedded capacitance conventional solutions.

These advantages include savings in silicon area devoted to capacitances. With tunable capacitive weighting according to the present embodiment, the number of capacitors and switching resources area required therewith are reduced, in comparison to conventional approaches. Thus, IC device 599 can be configured in a smaller die and at a lower cost, or silicon therein can be used for another purpose, increasing efficiency of design.

Capacitive weighting is driven as a function of the resolution of the switching signal of PWM 588, rather than conventional resolution of the capacitor array or non-linear DC bias to capacitive values, used with varactors. Further, with the switched capacitors C21 and C22 located outside the silicon of IC device 599, silicon "real-estate" therein is reduced by having capacitors C21 and C22 as external components that can be controlled internally, e.g., with other components of IC device 599.

A further advantage is that, in the present embodiment, only one switching device is used per crystal 501 leg, in contrast to one switching device per switched capacitor, characteristic of the conventional design. This has concomitant savings in switching control circuitry. Thus, in the present embodiment, switching FETs 511 and 521 switch capacitors C21 and C22 directly to their respective legs of crystal 501, and are respectively biased by single inverters 512 and 522.

Alternatively, in one embodiment the bulk capacitances of capacitors C11 and C12 are located outside the silicon of IC device 599 and the smaller switched capacitive elements C21 and C22 are located on the die of IC device 599. This can further advantageously reduce silicon die usage significantly. In another embodiment, the bulk capacitances of capacitors C11 and C12 and the PWM 588 switched capacitors C21 and C22 are all located off the silicon die of IC device 599.

Greater tolerance variation over conventional fixed capacitor loading array are achieved with the present embodiment, because the effects of the switching signal of PWM 588 compensate for such variations.

In fabricating smaller capacitors such as are used in conventional approaches, silicon process and capacitive variations must be carefully tracked to ensure capacitive accuracy. Further, with such smaller capacitors characteristic of conventional approaches, external variations, loading and other factors can have significant negative impact on conventional designs. Advantageously however, the larger capacitors C11, 12, 21, and 22 of the present embodiment are inherently less sensitive to such process fluctuations.

PWM effects, e.g., control over the switching signal provided by PWM 588, compensate for variations such as temperature related capacitance change variation. Such control is driven in one embodiment wherein PWM 588 comprises part of a feedback system 577. In one embodiment, feedback system 577 comprises a larger feedback loop. Resistance 586 provides a termination for the PWM signal.

Figure 6:
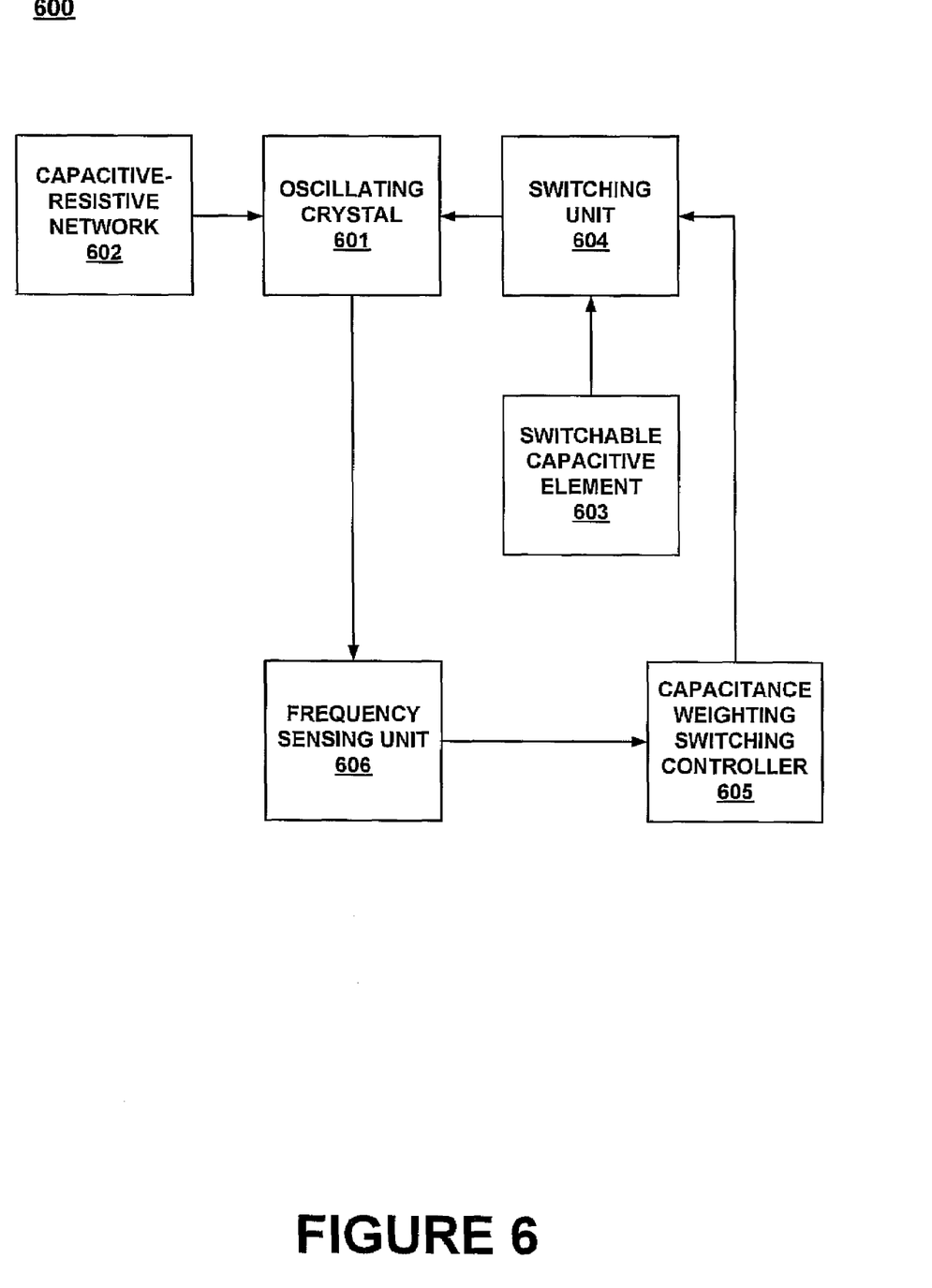
FIG. 6 depicts an exemplary system for fine tuning crystal frequency accuracy with a tunable fractional capacitance, according to an embodiment of the present invention.

FIG. 6 depicts an exemplary system 600 for fine tuning crystal frequency accuracy, according to an embodiment of the present invention. System 600 has an oscillating crystal 601, which in one embodiment comprises a part of an oscillator circuit. Crystal 601 is coupled to a capacitive-resistive network 602. In one embodiment, crystal 601 and capacitive-resistive network 602 are fixedly coupled, electrically.

In one embodiment, the capacitive and resistive values associated with capacitive-resistive network 602 are substantially constant such that, coupled with crystal 601, they provide thereto a substantially constant capacitance. It is appreciated that, while resistance and/or capacitance values associated therewith may change with temperature variations and other factors, perhaps significantly, such changes are addressed by the feedback described. In the context of the present embodiment, such changes in the capacitance values provided to crystal 601 with capacitive-resistive network 602 are not especially significant. The capacitive and resistive values associated with capacitive-resistive network 602 affect the frequency at which oscillation crystal 601 resonates.

A switchable capacitive element 603 is switchably coupled to crystal 601 with a switching unit 604. In one embodiment, a capacitance value associated with switchable capacitive element 603 is provided to crystal 601 when switching unit 604 couples the element thereto, thus then affecting the oscillation frequency thereof, e.g., in summation with the capacitance value provided with capacitive-resistive network 602. However, when switching unit 604 is not coupling switchable capacitive element 603 to crystal 601, its capacitance value is not coupled thereto to affect the crystal's oscillating frequency.

A capacitance weighting switching controller 605 controls the switching action of switching unit 604 in coupling switchable capacitive element 603 to crystal 601. In one embodiment, capacitance weighting switching controller 605 thus modulates the time during which switchable capacitive element 603 is coupled to crystal 601. With such time multiplexing, capacitance weighting switching controller 605 modulates the total capacitance value provided to crystal 601 over time, effectively achieving capacitive dithering to fine tune the frequency at which crystal 601 oscillates. In one embodiment, capacitance weighting switching controller 605 functions with pulse width modulation. In another embodiment, capacitance weighting switching controller 605 functions with a sigma-delta control.

A frequency sensing unit 606 senses the frequency at which crystal 601 resonates and generates a corresponding frequency signal. In one embodiment, capacitance weighting switching controller 605 accesses the frequency signal of frequency sensing unit 606 and controls the switching function of switching unit 604 in accordance therewith. Thus, capacitance weighting switching controller 605 achieves feedback based control over the oscillation of the crystal, as the capacitance associated with switchable capacitive element 603 is controllably coupled and decoupled therewith based on that frequency to achieve fine control over that frequency.

Thus, where the crystal's frequency of oscillation initially drifts, e.g., rises above or falls below a given frequency, such as a center frequency, target frequency, etc., the output signal of frequency sensing unit 606 changes proportionally. Sensing the change in the output signal of frequency sensing unit 606, capacitance weighting switching controller 605 responsively causes switching unit 604 to allow the capacitance of switchable capacitive element 603 to be coupled to the crystal 601 for a correspondingly greater or lesser period of time.

The total capacitance coupled to the crystal 601, including that of capacitive-resistive network 602 combined with that of switchable capacitive element 603 when it is coupled to crystal 601, thus changes in accordance with the time switchable capacitive element 603 is coupled thereto with switching unit 604. For the modulated periods of time the capacitance of switchable capacitive element 603 is coupled to crystal 601, the reactance of the crystal 601 changes to reflect that capacitance. The oscillation frequency of crystal 601 changes according to its reactance, to compensate for its initial frequency drift. System 600 thus fine tunes the oscillating frequency of crystal 601.

In one embodiment, system 600 is deployed partly on and partly off a single IC device (chip). For instance, in one embodiment, switchable capacitive element 603, crystal 601, and/or capacitance weighting switching controller 605 are off-chip and other components of circuit 600 are on-chip.

Figure 7:
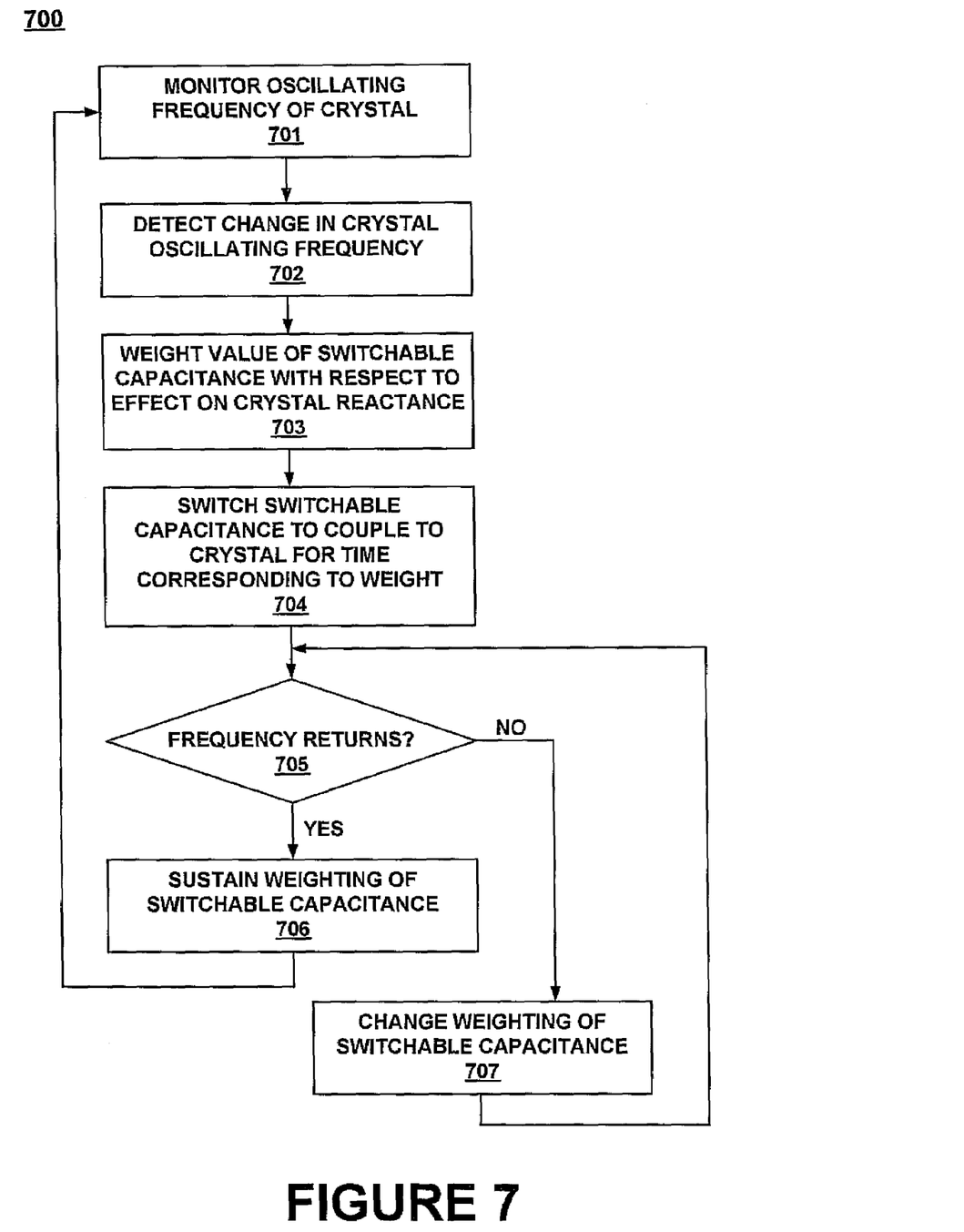
FIG. 7 is a flowchart of an exemplary method for fine tuning crystal frequency accuracy with a tunable fractional capacitance, according to an embodiment of the present invention.

FIG. 7 is a flowchart of an exemplary method 700 for fine tuning crystal frequency accuracy with a tunable fractional capacitance, according to an embodiment of the present invention. Process 700 begins with step 701, wherein the frequency of oscillation of a crystal is monitored.

In step 702, a change is detected in the oscillating frequency of a crystal, for instance from a center (e.g., central, target, main, original, etc.) frequency. In one embodiment, the crystal is coupled, e.g., fixedly, with a substantially constant capacitance, such as that of a resistive-capacitive network.

Responsive to the change in crystal oscillating frequency detected, in step 703, the capacitance value of a switchable capacitance is weighted with respect to its effect upon the reactance of the oscillating crystal, such as with pulse width modulation, sigma-delta control, or another technique.

In step 704, the switchable capacitance is switchably coupled to the crystal for an amount of time corresponding to the weighting of its capacitance value, thus affecting the reactance of the crystal and changing its oscillating frequency accordingly.

In step 705, it is determined whether the crystal oscillating frequency returns to the center frequency. If so, in step 706 the weighting of the capacitance value of the switchable capacitance is sustained, such that the time wherein the switchable capacitance is coupled to the crystal, e.g., relative to the crystal oscillating frequency, is held.

If not, in step 707 the weighting of the capacitance value of the switchable capacitance is changed, such that the time wherein the switchable capacitance is coupled to the crystal, e.g., relative to the crystal oscillating frequency, is changed (e.g., increased or decreased), and step 705 is repeated. Upon completion of step 706, process 700 repeats step 701.

In summary, a circuit, system, and method for fine tuning crystal frequency accuracy are described herein. In one embodiment, a circuit fine tunes crystal frequency accuracy with a tunable fractional capacitance. The circuit includes a first capacitance coupled with the crystal to provide an effectively constant reactive loading thereto. A second capacitance is controllably coupleable with the crystal. The circuit also includes a switching device controllable for coupling the second capacitance to the crystal wherein an effective capacitance value associated with the second capacitance varies according to the time periods in which the second capacitance is coupled thereto.

Embodiments of the present invention, a circuit, system, and method for fine tuning crystal frequency accuracy are thus described. While the present invention has been described in particular embodiments, it should be appreciated that the present invention should not be construed as limited by such embodiments, but rather construed according to the following claims and their equivalents.

What is claimed is:

1. A circuit for fine tuning the resonating frequency of a crystal, comprising:

a first capacitance coupled with said crystal;

a second capacitance controllably coupleable with said crystal;

a switching device controllable for switchably coupling said second capacitance with said crystal wherein an effective capacitance value associated with said second capacitance varies according to a time associated with said switchable coupling and wherein said resonating frequency changes according to a capacitive loading of said crystal wherein said capacitive loading comprises said first capacitance plus said effective capacitance value of said second capacitance; and an integrated circuit device in which said first capacitance and said switching device are disposed wherein said second capacitance is external to said integrated circuit.

2. The circuit as recited in claim 1 wherein said first capacitance is fixedly coupled with said crystal.

3. The circuit as recited in claim 2 further comprising a resistive-capacitive network coupled with said crystal wherein said first capacitance comprises a component of said resistive-capacitive network.

4. The circuit as recited in claim 1 wherein said switching device is controllable with pulse width modulation to achieve said switchable coupling.

5. The circuit as recited in claim 1 wherein said switching device is controllable with feedback from said resonating frequency.

6. The circuit as recited in claim 1 wherein said switching device comprises a transistor.

7. The circuit as recited in claim 1 further comprising an integrated circuit device wherein said first capacitance is external to said integrated circuit.

8. The circuit as recited in claim 1 further comprising an integrated circuit device wherein said switching device is external to said integrated circuit.

9. A system for fine tuning the oscillating frequency of a crystal, comprising:

a capacitive-resistive network coupled with said crystal for providing a substantially constant capacitance value thereto;

a switchable capacitive element controllably coupleable to said crystal for providing a switched capacitance value thereto when so coupled;

a single switching device comprising:

a switching unit coupled with said switchable capacitance element and controllable for switchably coupling said switchable capacitive element to said crystal at high frequency; and a switching controller coupled with said switching unit for causing said switching unit to couple said switchable capacitance to said crystal wherein an effective capacitance value associated with said switchable capacitance is achieved with modulating the time said switchable capacitance element is coupled to said crystal according to said oscillating frequency of said crystal; and a frequency sensor coupled to said switching controller for monitoring said oscillating frequency of said crystal, wherein said switchable capacitance is external from an integrated circuit device in which said capacitive-resistive network and said switching unit are disposed.

10. The system as recited in claim 9 wherein said switching controller is external from an integrated circuit device in which said capacitive-resistive network and said switching unit are disposed.

11. The system as recited in claim 9 wherein said switching unit comprises a transistor.

12. The system as recited in claim 9 wherein said switchable capacitance is time multiplexed to said crystal in parallel with said capacitive value of said resistive-capacitive network.

13. The system as recited in claim 9 wherein said switching controller functions with pulse width modulation.

14. The system as recited in claim 13 wherein said pulse width modulation shapes noise away from the bandwidth of said crystal.

15. The system as recited in claim 13 wherein said pulse width modulation substantially separates switching noise associated with said high frequency from said oscillating frequency of said crystal.

16. A method for fine tuning the oscillating frequency of a crystal, comprising:

applying a static base loading capacitance to said crystal;

responsive to detecting a change in said oscillating frequency, multiplicatively weighting a second capacitance to achieve an effective weighted capacitance with timed switching multiplexing; and controllably loading said crystal with said effective weighted capacitance and said static base loading capacitance to achieve a total capacitive loading thereof according to said timed switching multiplexing, wherein a single switching mechanism is used, and wherein said total capacitive loading fine tunes said oscillating frequency to compensate for said change therein, and wherein said second capacitance is external to an integrated circuit device which said static base loading capacitance and said single switching mechanism are disposed.

17. The method as recited in claim 16 further comprising monitoring said oscillating frequency.

18. The method as recited in claim 16 wherein said timed switching multiplexing comprises pulse width modulation.

* * * * *